US007406701B2

(12) United States Patent
Kim

(10) Patent No.: US 7,406,701 B2
(45) Date of Patent: Jul. 29, 2008

(54) FLEXIBLE CABLE AND DISK DRIVE WITH THE SAME

(75) Inventor: Pyung-Lae Kim, Yongin-si (KR)

(73) Assignee: LG Electronics Inc., Seoul (KR)

( * ) Notice: Subject to any disclaimer, the term of this patent is extended or adjusted under 35 U.S.C. 154(b) by 434 days.

(21) Appl. No.: 10/786,309

(22) Filed: Feb. 26, 2004

(65) Prior Publication Data

US 2004/0233564 A1 Nov. 25, 2004

(30) Foreign Application Priority Data

May 19, 2003 (KR) ........................ 10-2003-0031679

(51) Int. Cl.
  *G11B 33/12* (2006.01)
  *H05K 1/11* (2006.01)
(52) U.S. Cl. ..................................... 720/652
(58) Field of Classification Search ................ 720/652, 720/685; 360/234.5, 264.2, 266.3, 271.9, 360/245.8, 245.9; 174/254, 72 R, 524, 532, 174/542, 261, 117 F
See application file for complete search history.

(56) References Cited

U.S. PATENT DOCUMENTS

| 4,967,296 | A | * | 10/1990 | Wiens et al. | ............... 360/266.5 |
| 5,130,499 | A | * | 7/1992 | Dijkshoorn | ................. 174/254 |
| 5,923,501 | A | * | 7/1999 | Suzuki et al. | ............. 360/264.2 |
| 6,272,090 | B1 | | 8/2001 | Maeda | ........................ 720/607 |
| 6,469,970 | B2 | * | 10/2002 | Nishi | ......................... 720/685 |
| 6,910,218 | B2 | * | 6/2005 | Park et al. | .................... 720/653 |
| 6,981,271 | B2 | * | 12/2005 | Minase et al. | ............... 720/652 |
| 2003/0043508 | A1 | * | 3/2003 | Schulz et al. | ............ 360/245.9 |
| 2003/0202447 | A1 | * | 10/2003 | Watanabe et al. | .......... 369/75.2 |
| 2004/0205785 | A1 | * | 10/2004 | Takahashi et al. | ........... 720/601 |
| 2006/0005215 | A1 | * | 1/2006 | Wu | ............................. 720/652 |

FOREIGN PATENT DOCUMENTS

| EP | 1426964 A1 | * | 9/2004 |
| JP | 2005-322349 A | * | 11/2005 |
| WO | WO 02084665 A1 | * | 10/2002 |
| WO | WO 03/017279 A1 | * | 2/2003 |

OTHER PUBLICATIONS

Buetow, Mike. "Designing Flexible Circuits". Aug. 2004. Printed Circuit Design & Manufacture, v. 21, No. 8, p. 38-39.*

* cited by examiner

*Primary Examiner*—Julie Anne Watko
(74) *Attorney, Agent, or Firm*—Ked & Associates, LLP

(57) ABSTRACT

A flexible cable and a disk drive with a flexible cable are provided. The disk drive includes a main base, a pickup base installed on the main base and provided with parts for recording and reproducing of signals on and from a disk, including an optical pickup linearly movable within a predetermined region, a board fixedly installed on a side of the main base and configured to control driving of the parts, including the optical pickup, and a flexible cable. The flexible cable includes a folded portion formed at a portion of a flexible cable main body so as to cause both ends of the flexible cable main body to extend in the same direction, wherein ends of the flexible cable connect to the optical pickup and the board at opposite positions, respectively, so as to transmit signals therebetween. With this structure, it is possible to efficiently use inner space of the disk drive.

11 Claims, 6 Drawing Sheets

FLEXIBLE CABLE AND DISK DRIVE WITH THE SAME

BACKGROUND OF THE INVENTION

1. Field of the Invention

The invention relates to a disk drive, and more particularly, to a flexible cable for electrically connecting a movable optical pickup to a fixed board in a disk drive.

2. Background of the Related Art

FIG. 1 is a schematic plan view of a related art disk drive. FIGS. 2A and 2B are schematic sectional views of a flexible cable used for connecting an optical pickup to a main board in the related art disk drive.

Referring to FIGS. 1-2B, a main base 1 forms a frame of the disk drive. The main base 1 includes a main board 2 on which a variety of parts for controlling the driving of the disk drive are installed. The main base 1 has a generally rectangular hole 2A at a center thereof, and a pickup base 3 is installed in the hole. The pickup base 3 is supported on the main base 1 at a rear end thereof by vibration-proof members 5 made, for example, of elastic material and configured to absorb vibrations and noises.

A spindle motor 7 configured to rotate a disk is positioned on the pickup base 3. A disk is seated on a turntable 8 which is provided at a top end of the spindle motor 7 and which is configured to be rotated by the spindle motor 7. An optical pickup 9 is installed on the pickup base 3 and is guided along guide shafts 10. The optical pickup 9 records or reads out signals by irradiating a signal-recording surface of the disk with light. The optical pickup 9 is driven by a sled motor (not shown) to move along the guide shafts 10.

An electrical connection between the optical pickup 9, which moves along the guide shafts 10, and the main board 2 is established by a flexible cable 11, generally referred to as a "FFC" (Flexible Flat Cable), as shown in FIGS. 2A-2B. The flexible cable 11 is flexible such that it can be freely bent to a certain extent. One end of the flexible cable 11 is connected to the main board 2 by a connector 11c and the other end thereof is connected to the optical pickup 9 so as to transmit signals between the main board 2 and the optical pickup 9.

A front end of the pickup base 3 is supported on a lift base 12. The lift base 12 is installed so that a front end thereof can be pivoted on a shaft 13 that functions as a center of rotation. Vibration-proof members 5' are interposed between the lift base 12 and the pickup base 3 to support the pickup base 3 on the lift base 12 and prevent transmission of vibrations and noises.

In the related art disk drive described above, the optical pickup 9 records signals on the disk or reproduces recorded signals while moving along the guide shafts 10 by means of a driving force from the sled motor (not shown). The flexible cable 11 is used for transmitting signals between the optical pickup 9 and the main board 2. Since the flexible cable 11 can be freely bent to a certain extent, as described above, it may be installed to be bent and protrude toward a side opposite to the optical pickup 9 with respect to the connector 11c, as shown in FIG. 2A. Further, when the optical pickup 9 moves toward the turntable 8, the flexible cable is pulled by the optical pickup 9, as shown in FIG. 2B.

However, there is the following problem in the related art disk drive described above. The flexible cable 11 is installed to protrude toward a side opposite to the optical pickup 9 with respect to the connector 11c for connection to the main board 2, making a connection between the main board 2 and the optical pickup 9. As the flexible cable 11 is installed as such, it is not possible to install other parts in a region A (see FIGS. 2A-2B) opposite to the optical pickup 9 with respect to the connector 11c. Therefore, there is the disadvantage that a length of a portion of the disk drive behind the optical pickup 9 relatively increases.

SUMMARY OF THE INVENTION

An object of the invention is to solve at least one or more of the above problems and/or disadvantages in a whole or in part and to provide at least the advantages described hereinafter.

In order to achieve at least the above objects, in whole or in part, and in accordance with the purposes of the invention, as embodied and broadly described, there is provided a flexible cable according to an embodiment of the invention comprising a flexible cable main body having one end configured to connect to a first part and the other end configured to connect to a second part on a side opposite to the first part and configured to transmit signals between the first and second parts, wherein at least one of the first and second parts is movable, and a folded portion formed by folding a portion of the cable main body so that two opposing faces are in contact with each other.

To further achieve at least the above objects, in whole or in part, and in accordance with the purposes of the invention, as embodied and broadly described, there is provided a flexible cable according to an embodiment of the invention comprising a first end configured to be connected to a first part and a second end configured to be connected to a second part so as to transmit signals between the first and second parts, at least one of the first and second parts being movable, and a folded portion formed by folding a portion of the flexible cable, wherein the folded portion does not deviate from vertical alignment with the first part.

To further achieve at least the above objects, in whole or in part, and in accordance with the purposes of the invention, as embodied and broadly described, there is provided a flexible cable according to an embodiment of the invention comprising a first end configured to be connected to a first part and a second end configured to be connected to a second part so as to transmit signals between the first and second parts, at least one of the first and second parts being movable, and at least one curved portion formed by folding a portion of the flexible cable, wherein a vertex of the curved portion does not deviate from vertical alignment with the first part.

To further achieve at least the above objects, in whole or in part and in accordance with the purposed of the invention, as embodied and broadly described, there is provided a disk drive according to an embodiment of the invention comprising a main base, a pickup base installed on the main base and provided with parts for recording and reproducing signals on and from a disk, including an optical pickup linearly movable within a predetermined region, a board fixedly installed on a side of the main base and configured to control driving of the parts including the optical pickup, and a flexible cable having a folded portion formed by folding a portion of a flexible cable main body, wherein two strips of cable extend from the folded portion in the same direction and are connected, respectively, to the optical pickup and the board so as to transmit signals therebetween.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
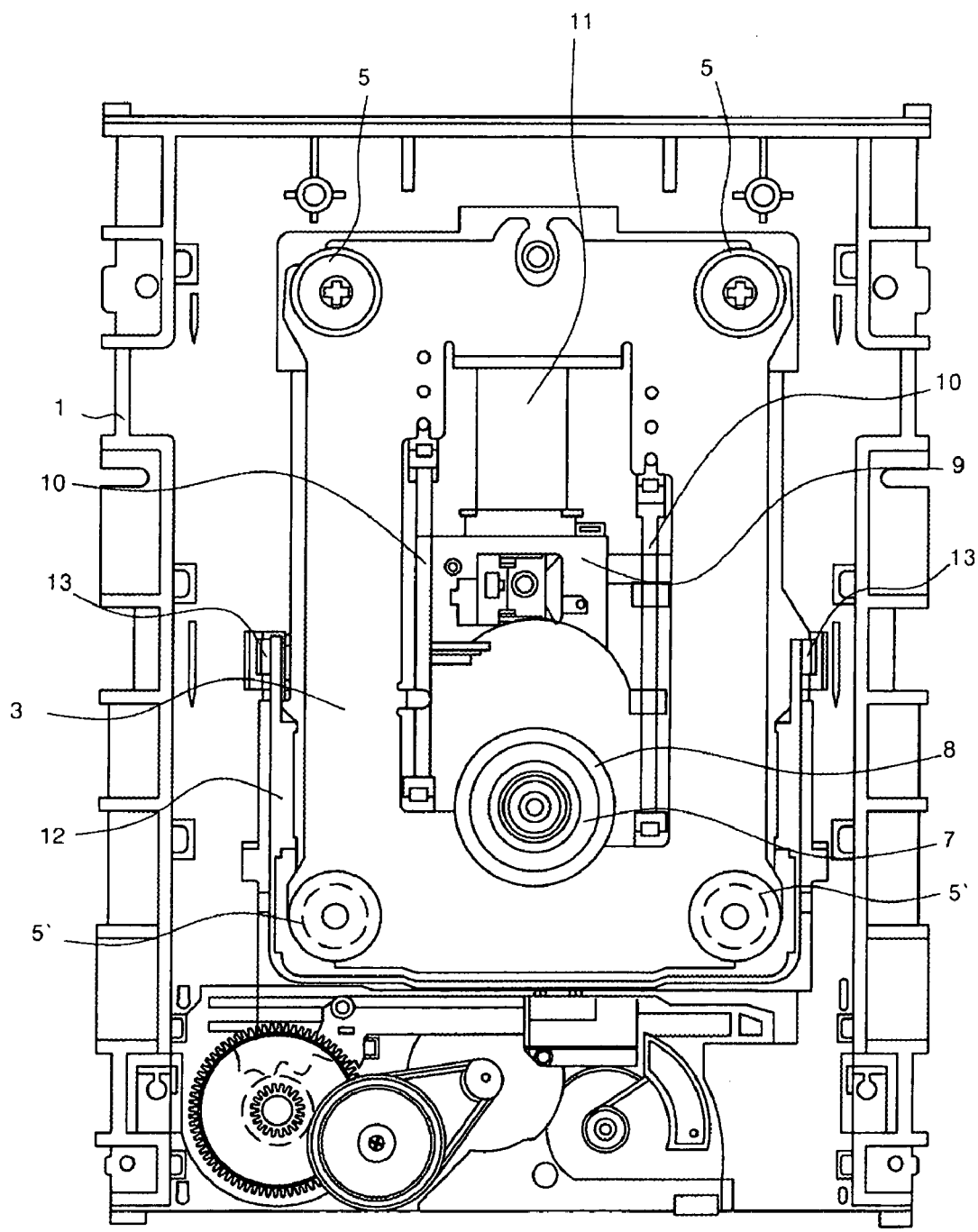
FIG. 1 is a schematic plan view of a related art disk drive.
Figure 2A:
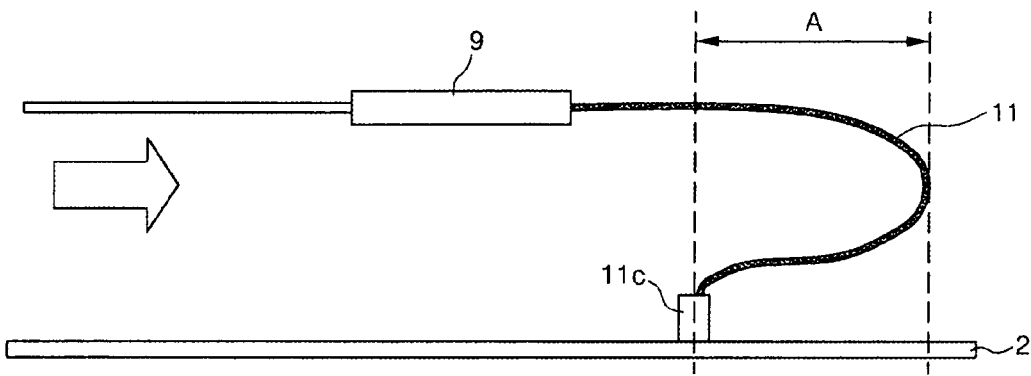
FIGS. 2A and 2B are schematic sectional views of a flexible cable used for connecting an optical pickup to a main board in the related art disk drive.
Figure 2B:
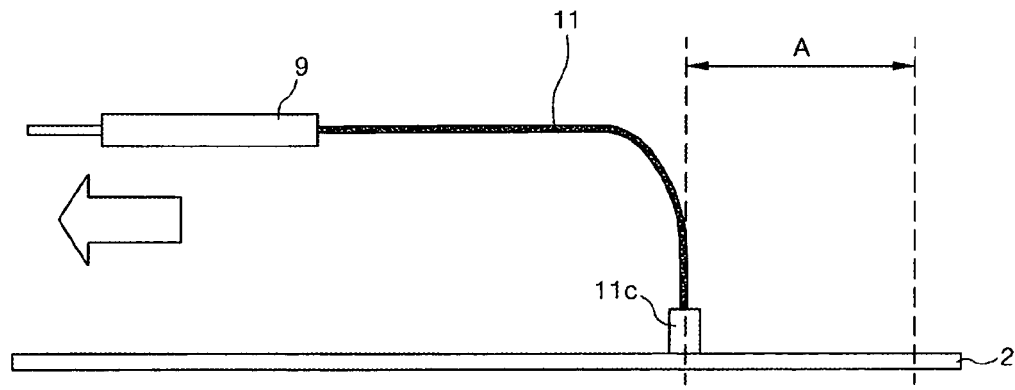
Figure 3:
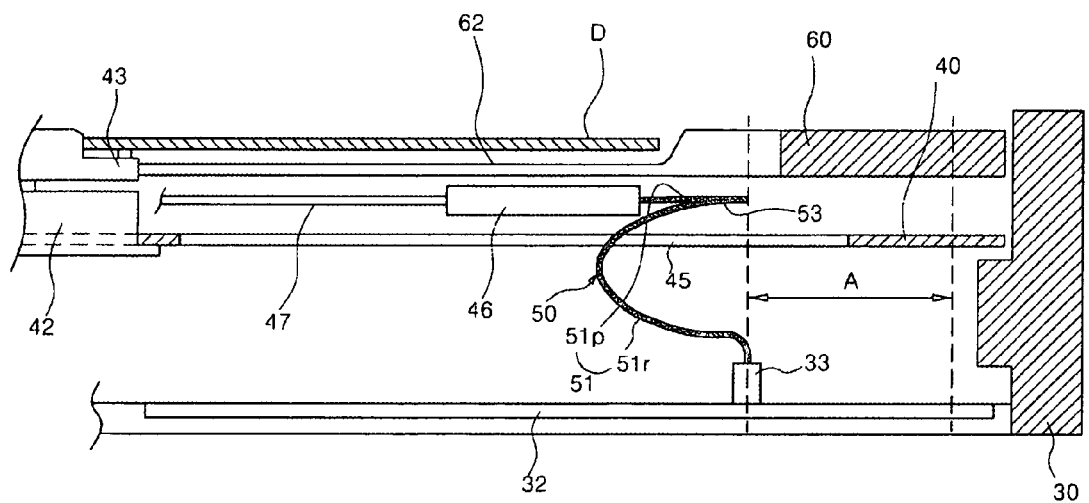
FIG. 3 is a schematic sectional view a disk drive with a flexible cable according to an embodiment of the invention.
Figure 4:
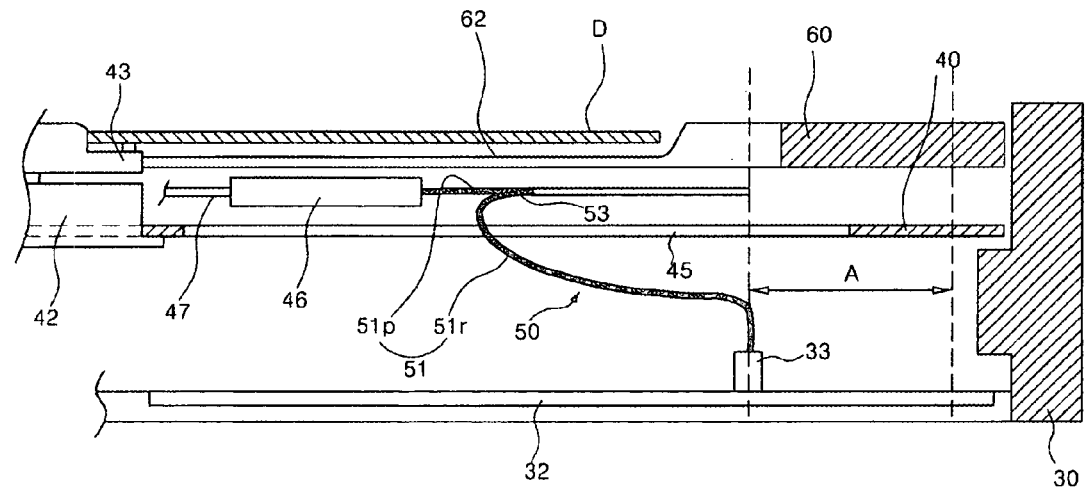
FIG. 4 is a schematic sectional view showing a state in which an optical pickup has moved toward an inner circumference of a disk in accordance with an embodiment of the invention.

FIG. 3 is a schematic sectional view of a disk drive according to an embodiment of the invention. FIG. 4 shows a state in which an optical pickup has moved toward an inner circumference of a disk in accordance with an embodiment of the invention.

Referring to FIGS. 3 and 4, a main base 30 forms a frame of the disk drive. A main board 32 is installed at a side of the main base 30. The main board 32 is not necessarily installed on the main base 30 and may be installed at a separate location. A variety of parts for controlling the driving of the disk drive are installed on the main board 32.

A pickup base 40 is installed on the main base 30. The pickup base 40 is provided with a variety of parts for recording signals and reproducing recorded signals on and from a disk D, as discussed below. A spindle motor 42 is installed on the pickup base 40, and a turntable 43 is mounted on a rotational shaft of the spindle motor 42. A disk D is seated on the turntable so as to be rotated therewith.

A tray 60 is installed on the main base 30. The tray 60 is installed so as to be movable inside and outside of the main base 30, and thus, functions to move the disk D between a loading position and an unloading position. The tray 60 has a disk-seating portion 62 configured for seating the disk D thereon.

A pickup window 45 having a predetermined area is formed in a center of the pickup base 40. An optical pickup 46 is installed in an area of the pickup window 45 so as to be movable along guide shafts 47 by an additional driving source (not shown). The guide shafts 47 are installed on the pickup base 40 and movably support both lateral ends of the optical pickup 46. The optical pickup 46 functions to record signals or reproduce recorded signals by irradiating a signal-recording surface of the disk D with light.

The optical pickup 46 and the main board 32 are connected using a flexible cable 50. A cable main body 51 is formed of a flexible material. One end of the cable main body 51 is connected to the optical pickup 46 and the other end is connected to the main board 32 by a connector 33. The cable main body 51 has a straight portion 51p, and a curved portion 51r having a predetermined curvature and which can be elastically deformed to allow changes in the curvature due to the movement of the optical pickup 46.

The cable main body 51 is divided into the straight portion 51p and the curved portion 51r by a folded portion 53. However, in practice, the curved portion 51r may not be formed upon manufacture of the flexible cable 50 but may be formed when the optical pickup 46 and the main board 32 are connected to each other using the flexible cable 50. In other words, the shape of the flexible cable 50 shown in the figures can be made when one end portion (straight portion 51p) of the flexible cable main body 51 is bent at the folded portion 53 and is connected to the optical pickup 46, and the other end portion, which becomes the curved portion 51r, is connected to the connector 33.

It can be seen from the figures that an end of the folded portion 53 is vertically aligned with and placed into the connector 33. In the embodiment of FIG. 3, the end of the folded portion 53 does not deviate from vertical alignment with the connector 33, as shown in FIG. 3, prior to movement of the optical pickup 46. In the embodiment of FIG. 3, the end of the folded portion 53 is positioned adjacent to the optical pickup rather than the connector 33 with the curved portion extending therebetween.

As the optical pickup 46 moves when the disk drive is driven, the folded portion 53 is repeatedly subjected to forces causing a portion of the folded portion 53 to be unfolded, as shown in FIG. 4. However, the folded portion 53 may include an additional provision for continuously maintaining the folded state of the cable main body 51, which will be described further herein below.

Figure 5:
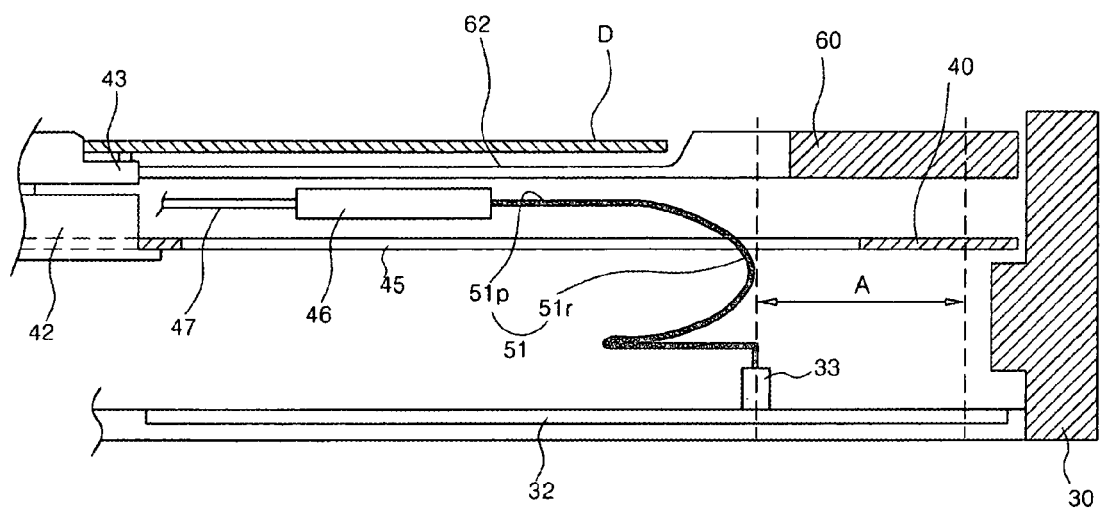
FIG. 5 is a schematic sectional view of a disk drive with a flexible cable according to another embodiment of the invention.

FIG. 5 shows another embodiment of the disk drive according to the invention. In this embodiment, the straight portion 51p of the cable main body 51 is connected to the connector 33 mounted on the main board 32, and the curved portion 51r is connected to the optical pickup 46. In such a case, even though the curved portion 51r of the cable main body 51 slightly protrudes toward a side opposite to the optical pickup 46 with respect to the connector 33, it is possible to relatively save some space in the disk drive over a conventional disk drive. In this embodiment, a vertex of the curved portion 51r does not deviate from vertical alignment with the connector 33, as shown in FIG. 5, prior to movement of the optical pickup 46. Further, in the embodiment of FIG. 5, the vertex of the curved portion 51r is positioned adjacent the optical pickup 46 rather than the connector 33.

Figure 6:
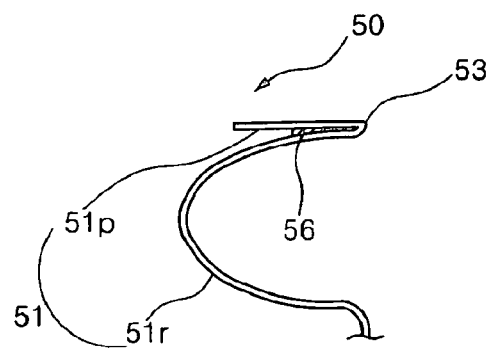
FIG. 6 is a schematic sectional view of a flexible cable according to an embodiment of the invention.

FIGS. 6 to 9 shows a variety of embodiments of the flexible cable according to the invention. FIG. 6 shows that an adhesive member 56 may be used to maintain the folded state of the folded portion 53 of the cable main body 51. The adhesive member 56 may be placed between contact portions of the straight portion 51p and the curved portion 51r on one or both sides of the folded portion 53 of the cable main body 51. Upon manufacture of the flexible cable 50, after the folded portion 53 is formed, the adhesive member 56 may then be placed between the straight portion 51p and the curved portion 51r to maintain the folded state. Examples of an adhesive member 56 include, but are not limited to, two-sided tapes or silicon materials. Other means of maintaining the folded sate of the folded portion 53 may also be provided.

Figure 7:
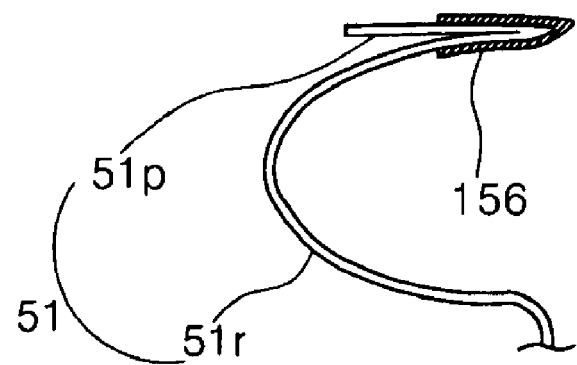
FIG. 7 is a schematic sectional view of a flexible cable according to another embodiment of the invention.

Another embodiment of the flexible cable is shown in FIG. 7 according to the invention and will be explained below. In this embodiment, a reinforcement folded-plate 156 may be used to maintain the folded state of the folded portion 53 of the cable main body 51. The reinforcement folded-plate 156 may be attached to both sides of the folded portion 53. The reinforcement folded-plate 156 is configured to maintain the shape of the folded portion 53 of the cable main body 51 using the shape of the reinforcement folded-plate itself. Referring to FIG. 7, the folded portion 53 of the cable main body 51 is placed between folded opposing portions of the reinforcement folded-plate 156. Alternatively, the reinforcement folded-plate 156 may be placed between the straight portion 51p and the curved portion 51r of the cable main body 51.

The reinforcement folded-plate 156 may be made of, for example, synthetic resin or metal. It is possible to form the reinforcement folded-plate 156 in the desired shape during manufacture of the reinforcement folded-plate 156. Alternatively, it is also possible to form the reinforcement folded-plate in the desired shape by bringing a preform into contact with the folded portion 53 and folding, i.e. plastically deforming, the preform.

Figure 8A:
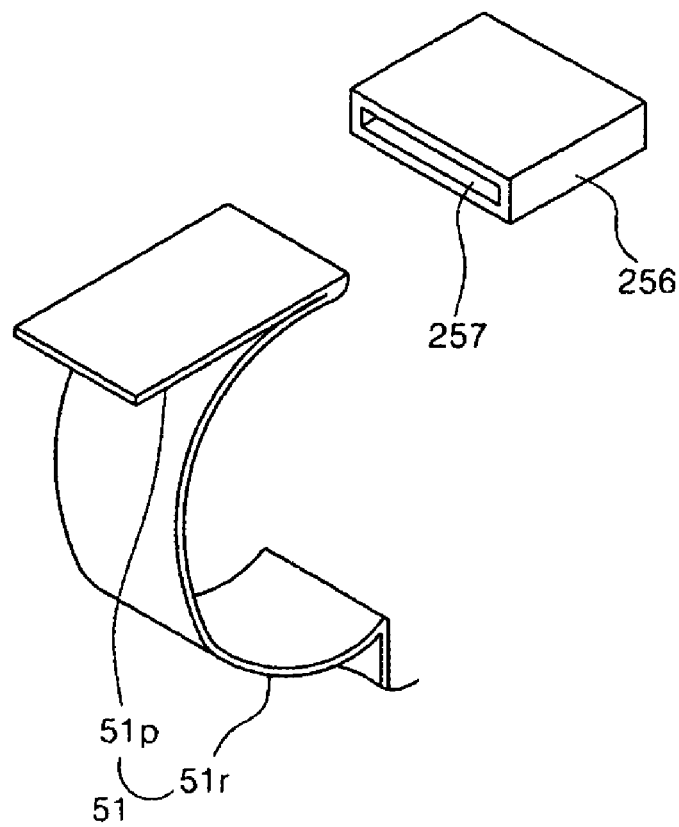
FIG. 8A is a schematic exploded perspective view of a flexible cable according to another embodiment of the invention.
Figure 8B:
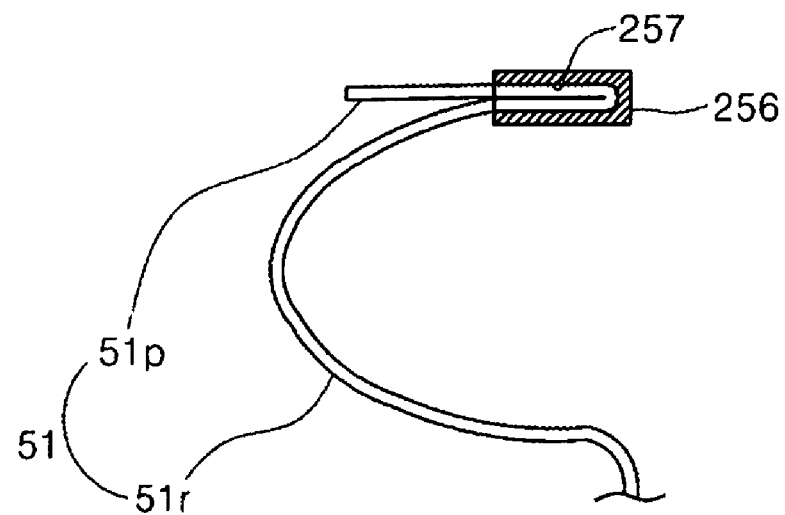
FIG. 8B is a schematic sectional view of the flexible cable of FIG. 8A.

FIGS. 8A and 8B show a further embodiment of the flexible cable according to the invention. In this embodiment, a folding clip 256 is used to maintain the folded state of the folded portion 53 of the cable main body 51. The folding clip 256 may be in the shape of a flat hexahedron and may be formed with an insertion slot 257 into which a predetermined length of the folded portion 53 of the cable main body 51 is inserted. Other shapes for the folding clip may also be appropriate. According to this embodiment, the folded portion 53 may be first formed in the cable main body 51 and then may be inserted into the insertion slot 257 of the folding clip 256, thereby maintaining the folded state of the folded portion 53, as shown in FIG. 8B.

Figure 9:
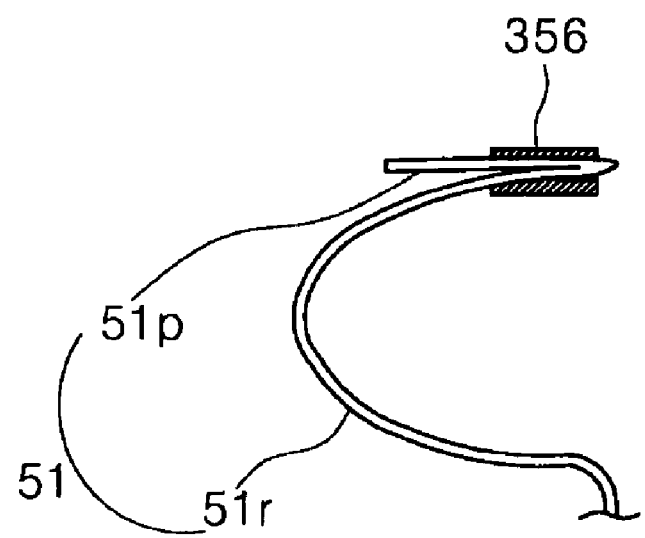
FIG. 9 is a schematic sectional view of a flexible cable according to yet another embodiment of the invention.

FIG. 9 shows a still further embodiment of the flexible cable according to the invention. A tape 356 is used to maintain the folded state of the folded portion 53 of the cable main body 51. In this embodiment, the tape 356 is used to wrap the straight portion 51p and the curved portion 51r on both sides of the folded portion 53 of the cable main body 51. The tape 356 is configured to maintain the folded state of the folded portion 53 by wrapping the straight portion 51p and the curved portion 51r together.

Hereinafter, operations of the flexible cable and the disc drive with the flexible cable in accordance with embodiments of the invention will be explained herein below with reference to the embodiments of FIGS. 3-4.

When a disk D is loaded into the disk drive and an operating signal is input, the disk D seated on the turntable 43 is rotated by the spindle motor 42 and the optical pickup 46 moves along the guide shafts 47 in a radial direction of the disk D so that signals can be recorded or reproduced.

The transmission of signals between the optical pickup 46 moving along the guide shafts 47 and the main board 32 are exchanged through the flexible cable 50. Examples of signals transmitted through the flexible cable 50 may include signals for operations of the optical pickup 46, signals to be recorded on the disk D, signals to be reproduced from the disk D, etc.

FIG. 3 shows a state in which the optical pickup 46 is positioned adjacent an outer circumference of the disk D, while FIG. 4 shows a state in which the optical pickup 46 is adjacent to a center of the disk D. It is noted that the straight portion 51p is not deformed and only the curved portion 51r is deformed as the optical pickup 46 moves along the guide shafts 10.

That is, in the state of FIG. 3, the curved portion 51r takes the shape of an arch having a relatively long radius of curvature. On the other hand, in the state of FIG. 4, a portion of the curved portion 51r takes the shape of an arch having a relatively small radius of curvature and the remainder thereof approximates to a straight line. That is, as the optical pickup 46 moves from the outer circumference to the inner circumference of the disk D, the curved portion 51r is elastically deformed so that the radius of curvature of the section of the curved portion 51r becomes small and the remainder thereof approximately takes the shape of a straight line. When the optical pickup 46 moves in the opposite direction, the curved portion 51r is restored to the original arched state, that is, the state of FIG. 3.

The invention provides at least the following advantages.

As described above, the flexible cable 50 does not protrude into a region A beyond the connector 33 when the optical pickup 46 is operated. Accordingly, the region A outside the connector 33 may be used as a space for installation of additional parts.

Further, since a space needed for installation of a flexible cable electrically connecting an optical pickup, which is a relatively movable part, to a fixed main board is minimized, it is possible to make the disk drive light, thin, and simple.

Also, even though a folded portion formed in the flexible cable is repeatedly subjected to forces as the optical pickup is operated, the folded portion is not unfolded due to the structure for maintaining the folded state of the folded portion. Thus, the durability of a product with the flexible cable is enhanced.

Further, the variety of embodiments for maintaining the folded state of the folded portion 51 of the flexible cable 50 described herein may be properly selected according to various conditions, such as design conditions of the disk drive. Although in certain circumstances the best performance can be obtained when the folding clip 256 is used, the folding clip 256 may not be suitable for, for example, a light, thin, and/or simple disk drive due to the thickness of the folding clip. In such a case, use of the adhesive member 56 or tape 356 may be more appropriate, improving workability, and making the disk drive light, thin, and simple.

The foregoing embodiments and advantages are merely exemplary and are not to be construed as limiting the invention. The present teaching can be readily applied to other types of apparatuses. The description of the invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A disk drive, comprising:
    a main base;
    a pickup base installed on the main base and provided with parts for recording and reproducing signals on and from a disk, including an optical pickup linearly movable within a predetermined region;
    a board fixedly installed on a side of the main base and configured to control driving of the parts including the optical pickup; and
    a flexible cable having a folded portion in the form of a portion of a flexible cable main body folded so that two opposing faces are in contact with each other, wherein two strips of cable extend from the folded portion in the same direction and are connected, respectively, directly to the optical pickup and to the board so as to transmit signals therebetween, wherein movement of the optical pickup is configured to be between an inner end and an outer end of said predetermined region and wherein corresponding movement of said flexible cable main body is configured to occur only to one side of a position of the folded portion when said optical pickup is at said outer end.

2. The disk drive as claimed in claim 1, further comprising:
a tray configured to move inside and outside the main base so as to move the disk between a loading position and an unloading position.

3. The disk drive as claimed in claim 1, wherein the cable main body is divided into a straight portion and a curved portion with respect to the folded portion.

4. The disk drive claimed in claim 3, wherein the folded portion is formed adjacent one of the optical pickup and the board.

5. The disk drive as claimed in claim 1, further comprising a folded-state maintaining device configured to maintain a folded state of the cable main body.

6. The disk drive as claimed in claim 5, wherein the folded-state maintaining device comprises an adhesive member configured to bond both faces of the folded portion to each other.

7. The disk drive as claimed in claim 5, wherein the folded-state maintaining device comprises a reinforcement folded-plate attached to at least one side of both sides of the folded portion.

8. The disk drive as claimed in claim 5, wherein the folded-state maintaining comprises a folding clip with an insertion slot into winch the folded portion is inserted.

9. The disk drive as claimed in claim 5, wherein the folded-state maintaining device comprises a tape configured to wrap both sides of the folded portion.

10. The disk drive of claim 1, wherein said folded portion and said two strips of cable are vertically aligned.

11. The disk drive of claim 10, wherein said folded portion and said two strips of cable are vertically aligned throughout their respective entire lengths.

* * * * *